United States Patent [19]

Oishi et al.

[11] Patent Number: 4,774,692
[45] Date of Patent: Sep. 27, 1988

[54] SENSE CIRCUIT OF A SEMICONDUCTOR MEMORY DEVICE

[75] Inventors: Motohiro Oishi; Kunio Matsudaira, both of Ikeda; Keiji Fukumura, Toyonaka, all of Japan

[73] Assignee: Ricoh Company, Ltd., Tokyo, Japan

[21] Appl. No.: 122,452

[22] Filed: Nov. 19, 1987

[30] Foreign Application Priority Data

Nov. 20, 1986 [JP] Japan ................................ 61-278387

[51] Int. Cl.$^4$ ........................... G11C 7/00; H03K 3/01
[52] U.S. Cl. .................................... 365/207; 307/530; 307/270; 307/356; 365/196
[58] Field of Search ............... 307/530, 354, 362, 246, 307/270, 355, 356, 475, 491, 264; 365/207, 196, 205

[56] References Cited

U.S. PATENT DOCUMENTS

| 4,506,164 | 3/1985 | Higuchi | 307/475 |
| 4,618,785 | 10/1986 | Tran | 307/475 |
| 4,692,642 | 9/1987 | Fukuzo et al. | 307/530 |

Primary Examiner—Stanley D. Miller
Assistant Examiner—Trong Q. Phan
Attorney, Agent, or Firm—Oblon, Fisher, Spivak, McClelland & Maier

[57] ABSTRACT

A sense circuit of a semiconductor memory transistor includes a bit line connected to a memory cell which stores "1" or "0". The sense circuit includes a MOS transistor which has its gate connected to the bit line, its source connected to ground voltage and its drain connected to a supply voltage through a load MOS transistor. The sense circuit also includes a compensating circuit for compensating the voltage at the bit line when the ground voltage has fluctuated. For example, the compensating circuit includes a pull-up circuit for pulling up the voltage at the bit line when the ground voltage has shifted to the positive side and a pull-down circuit for pulling down the voltage at the bit line when the ground voltage has shifted to the negative side, thereby maintaining the relative voltage relationship between the voltage at the bit line and the ground voltage at a proper value.

8 Claims, 2 Drawing Sheets

SENSE CIRCUIT OF A SEMICONDUCTOR MEMORY DEVICE

BACKGROUND OF THE INVENTION

1. Field of the Invention

This invention generally relates to a semiconductor device, and, in particular, to a sense circuit of a semiconductor memory device for sensing the data written in the memory device to be either "1" or "0."

2. Description of the Prior Art

A typical prior art sense circuit comprised of an N-channel MOS transistor is shown in FIG. 2. As shown, the sense circuit includes a bit line connected to a memory cell 4. The bit line 2 is connected to a voltage source $V_{cc}$ through a MOS transistor 6 for supplying current to the memory cell 4. Also provided is a MOS transistor 8 for detecting the potential of the bit line, and the MOS transistor 8 has its gate connected to the bit line 2, its source connected to a ground terminal, and its drain connected to the supply voltage $V_{cc}$ through a depletion-type MOS transistor 10 serving as a load. The MOS transistors 6 and 10 have their gates connected to a node 11 which is a junction between the MOS transistors 8 and 10, and the node 11 defines an output of the sense circuit and is connected to an amplifier 12.

In this prior art sense circuit, the voltage at the bit line 2 is detected by a voltage difference $V_{gs}$ between the gate and the source of the MOS transistor 8. And, if the ground potential fluctuates due to noises from inside and outside of the semiconductor device, an erroneous operation in detecting the voltage at the bit line 2 or reading of the memory cell 4 would result. And, if a noise margin is to be provided for such fluctuations of the ground level, there is produced a reduction in the operational speed as a memory speed, such as data read out speed, so that the overall performance of the memory device would deteriorate.

SUMMARY OF THE INVENTION

In accordance with the principle of the present invention, there is provided a sense circuit for sensing the memory state of a semiconductor memory device which comprises compensating means for compensating the voltage of a bit line when a reference voltage, such as ground voltage, has fluctuated to thereby restore a relative voltage relationship between the voltage at the bit line and the reference voltage to a proper value. In one embodiment, the compensating means includes a pull-up circuit for pulling up the voltage at the bit line by supplying current to the bit line when the reference voltage, such as ground voltage, has deviated to the positive side. In another embodiment, the compensating means includes a pull-down circuit for pulling down the voltage at the bit line by discharging current from the bit line when the reference voltage has deviated to the negative side.

It is therefore a primary object of the present invention to obviate the disadvantages of the prior art as described above and to provide an improved sense circuit of a semiconductor memory device.

Another object of the present invention is to provide an improved sense circuit for sensing a memory state of a semiconductor memory device.

A further object of the present invention is to provide an improved sense circuit of a semiconductor memory device which can restore a relative voltage relationship between the voltage at a bit line and a reference voltage, such as ground voltage, to a proper value quickly when a deviation has occurred from the reference voltage.

A still further object of the present invention is to provide an improved sense circuit of a semiconductor memory device high in performance and reliable in operation.

Other objects, advantages and novel features of the present invention will become apparent from the following detailed description of the invention when considered in conjunction with the accompanying drawings.

DESCRIPTION OF THE PREFERRED EMBODIMENTS

Figure 1:
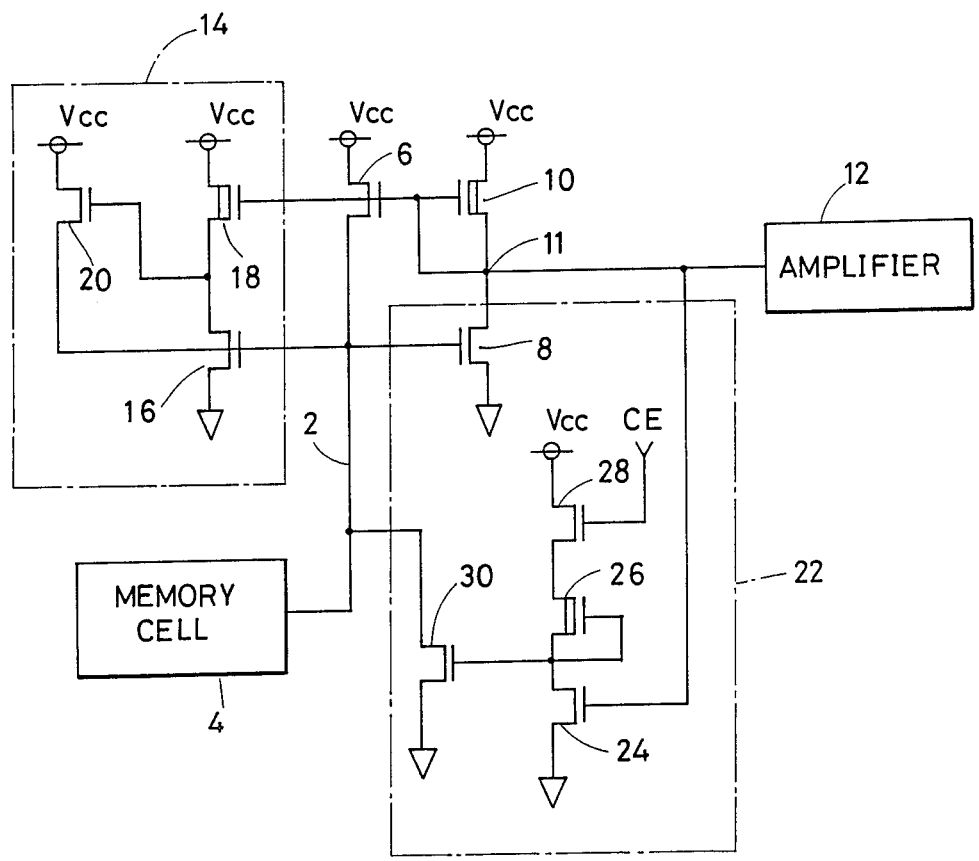
FIG. 1 is a circuit diagram showing a sense circuit of a semiconductor memory device constructed in accordance with one embodiment of the present invention.
Figure 2:
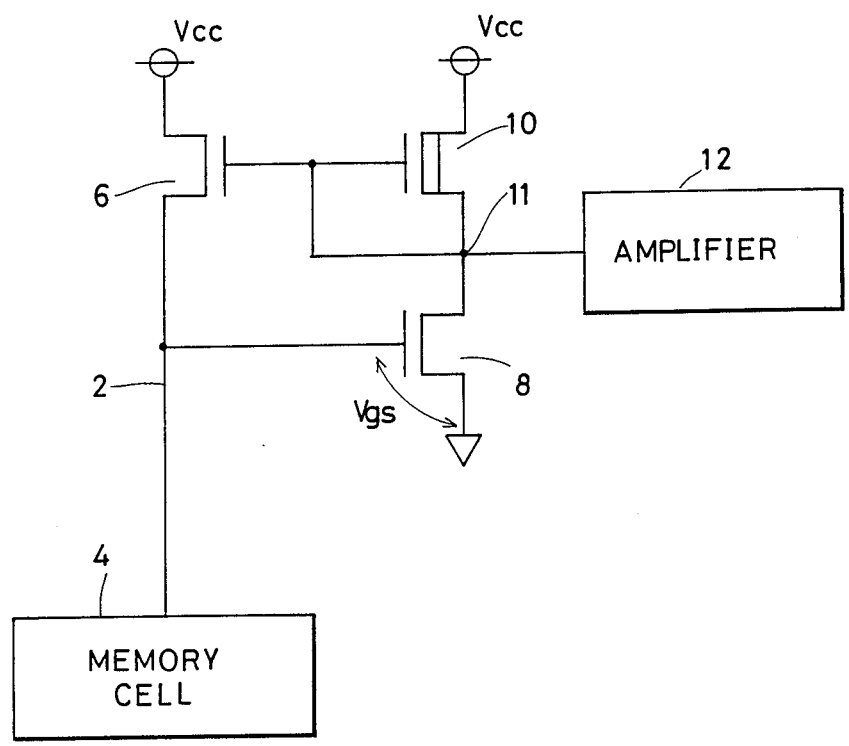
FIG. 2 is a circuit diagram showing a prior art sense circuit of a semiconductor memory device.

Referring now to FIG. 1, there is shown a sense circuit of a semiconductor memory device constructed in accordance with one embodiment of the present invention. The illustrated sense circuit is comprised by using a N-channel MOS transistor. In the structure shown in FIG. 1, a sense circuit portion including MOS transistors 6, 8 and 10 connected between a memory cell 4 and an amplifier 12 corresponds to the sense circuit shown in FIG. 2:

As shown in FIG. 1, the present sense circuit includes a bit line voltage pull-up circuit 14 for pulling up the voltage at a bit line 2 when necessary. The pull-up circuit 14 includes a MOS transistor 16 which has its gate connected to the bit line 2, its source connected to a ground terminal and its drain connected to a supply voltage $V_{cc}$ through a depletion-type MOS transistor 18 serving as a load. The MOS transistor 16 has a function of detecting fluctuations in the ground voltage. The structure defined by MOS transistors 16 and 18 is identical to the structure defined by MOS transistors 8 and 10, so that a balance is attained by these two circuit structures to thereby allow to provide an enhanced operational speed. The pull-up circuit 14 further includes a MOS transistor 20 connected between the bit line 2 and the supply voltage $V_{cc}$ for supplying current to the bit line 2 when necessary. The MOS transistor 20 has its gate connected to a node which is a junction between the MOS transistors 16 and 18.

The present sense circuit further includes a bit line voltage pull-down circuit 22 for pulling down the voltage at the bit line 2 when necessary. The pull-down circuit 22 includes the MOS transistor 8 of the sense circuit portion for detecting fluctuations in the ground voltage. The MOS transistor 8 has its drain (node 11) connected to the gate of a MOS transistor 24 which has its drain connected to supply voltage $V_{cc}$ through a series connection of a depletion-type MOS transistor 26 and a MOS transistor 28 and its source connected to a ground terminal. Both of the MOS transistors 26 and 28 define a load with a constant voltage CE applied to the gate of the MOS transistor 28 and the gate and source of the MOS transistor being shorted. The pull-down circuit 22 further includes a MOS transistor 30 connected between the bit line 2 and a ground terminal for discharging current from the bit line 2. The gate of the MOS transistor 30 is connected to the drain of the MOS transistor 24.

In operation, if the ground voltage has shifted to the positive side, a relative voltage relationship between the voltage at the bit line 2 and the ground voltage fluctuates during detection of positive side memory information of the memory cell 4, so that the MOS transistor 8 is turned off to cause an erroneous operation. In this case, the voltage between the gate and source of the MOS transistor 16 also changes, and, thus, the MOS transistor 16 turns off together with the MOS transistor 8. As a result, the voltage at the gate of the MOS transistor 20 increases to cause the MOS transistor 20 to be turned on, so that current is supplied to the bit line 2. Thus, the voltage at the bit line 2 increases to thereby restore a relative voltage relationship between the voltage at the bit line and the ground voltage, so that the time period of erroneous operation of the sense circuit portion is minimized.

On the other hand, if the ground voltage has shifted to the negative side, a relative voltage relationship between the voltage at the bit line 2 and the ground voltage changes during reading out of the lower voltage side of the information stored in the memory cell 4, so that the MOS transistor 8 is turned on to cause an erroneous operation. As the MOS transistor 8 is turned on, the voltage at the gate of the MOS transistor 24 is lowered to thereby cause the MOS transistor 24 to be turned off. As a result, the voltage at the gate of the MOS transistor 30 increases to thereby cause the MOS transistor 30 to be turned on, so that current is discharged from the bit line 2, thereby causing the voltage at the bit line 2 to be lowered. With this, the relative voltage relationship between the voltage at the bit line 2 and the ground voltage at the MOS transistor 8 is restored, whereby the time period of erroneous operation at the sense circuit portion is minimized.

As described above, both of the bit line voltage pull-up circuit 14 and the bit line voltage pull-down circuit 22 detect a variation in the ground voltage when such a variation in the ground voltage has occurred. And, in the former case, when the ground voltage has shifted toward the positive side, the pull-up circuit 14 is activated to pull up the voltage at the bit line 2 to restore the relative voltage relationship between the ground voltage and the voltage at the bit line 2 to a proper value. On the other hand, in the latter case, when the ground voltage has shifted to the negative side, the pull-down circuit is activated to pull down the voltage at the bit line 2 to restore the relative voltage relationship between the ground voltage and the voltage at the bit line 2 to a proper value.

It is to be noted that, in the above-described embodiment, both of the bit line voltage pull-up circuit 14 and the bit line pull-down circuit 22 are connected to the bit line 2. However, only one of either of the pull-up circuit 14 and the pull-down circuit 22 may be connected to the bit line 2. In addition, each of the pull-up and pull-down circuits 14 and 22 may have a specific circuit structure different from that illustrated in FIG. 1 as long as an equivalent circuit function can be obtained. In this manner, in accordance with the present invention, even if a reference voltage, e.g., ground voltage in the above-described embodiment, has shifted due, for example, to noises, the time period of occurrence of an erroneous operation in a sense circuit can be minimized. Thus, there can be provided a noise immune sense circuit of a semiconductor memory device.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A sense circuit for sensing memory information by a voltage difference between a voltage at a bit line and a reference voltage, comprising:
    a bit line connected to a memory cell;
    sensing means connected between said bit line and a reference voltage for sensing a data stored in said memory cell by detecting a voltage difference between a voltage at said bit line and said reference voltage; and
    compensating means connected to said bit line and said reference voltage for compensating the voltage at said bit line when said reference voltage has shifted from a reference level.

2. The sense circuit of claim 1 wherein said compensating means includes a pull-up circuit for supplying current to said bit line when said reference voltage has shifted to a positive side from said reference level.

3. The sense circuit of claim 2 wherein said pull-up circuit includes a first MOS transistor having a gate connected to said bit line and a source connected to said reference voltage, whereby said pull-up circuit supplies current to said bit line when said first MOS transistor has been turned off.

4. The sense circuit of claim 3 wherein said pull-up circuit further includes a second MOS transistor which is connected between a supply voltage and said bit line and which has a gate connected to a drain of said first MOS transistor.

5. The sense circuit of claim 1 wherein said compensating means includes a pull-down circuit for discharging current from said bit line when said reference voltage has shifted to a negative side from said reference level.

6. The sense circuit of claim 5 wherein said pull-down circuit includes a third MOS transistor having a gate connected to said bit line and a source connected to said reference voltage, whereby said pull-down circuit discharges current from said bit line when said third MOS transistor has been turned on.

7. The sense circuit of claim 6 wherein said pull-down circuit further includes a fourth MOS transistor which is connected between said bit line and said reference voltage and which has a gate connected to receive a high voltage when said third MOS transistor has been turned on, thereby establishing a current discharging path from said bit line to said reference voltage through said fourth MOS transistor.

8. The sense circuit of claim 7 wherein said third MOS transistor defines part of said sensing means.

* * * * *